(12) United States Patent
Kishimoto et al.

(10) Patent No.: US 7,029,977 B2
(45) Date of Patent: Apr. 18, 2006

(54) FABRICATION METHOD OF SEMICONDUCTOR WAFER

(75) Inventors: Daisuke Kishimoto, Kanagawa (JP);
Susumu Iwamoto, Kanagawa (JP);
Katsunori Ueno, Kanagawa (JP);
Ryohsuke Shimizu, Kanagawa (JP);
Satoshi Oka, Gunma (JP)

(73) Assignees: Fuji Electric Holdings Co., Ltd., Tokyo (JP); Shin-Etsu Handotai Co., Ltd., Tokyo (JP)

( * ) Notice: Subject to any disclaimer, the term of this patent is extended or adjusted under 35 U.S.C. 154(b) by 49 days.

(21) Appl. No.: 10/792,884

(22) Filed: Mar. 5, 2004

(65) Prior Publication Data

US 2004/0185665 A1 Sep. 23, 2004

(30) Foreign Application Priority Data

Mar. 7, 2003 (JP) .............................. 2003-062103

(51) Int. Cl.
*H01L 21/336* (2006.01)
*H01L 21/4763* (2006.01)

(52) U.S. Cl. ...................... 438/269; 438/270; 438/274; 438/700

(58) Field of Classification Search ................ 438/268, 438/269, 270, 274, 700
See application file for complete search history.

(56) References Cited

U.S. PATENT DOCUMENTS

| | | |
|---|---|---|
| 5,216,275 A | 6/1993 | Chen |
| 5,423,941 A * | 6/1995 | Komura et al. ............. 438/700 |
| 5,438,215 A | 8/1995 | Tihanyi |
| 6,403,412 B1 * | 6/2002 | Economikos et al. ....... 438/238 |
| 6,495,294 B1 * | 12/2002 | Yamauchi et al. .......... 438/597 |

FOREIGN PATENT DOCUMENTS

| | | |
|---|---|---|
| EP | 0053854 | 6/1982 |
| JP | 09-266311 A1 | 10/1997 |
| JP | 2000-340578 | 12/2000 |
| JP | 2001-168327 | 6/2001 |
| JP | 2001-196573 | 7/2001 |
| JP | 2002-141407 | 5/2002 |

OTHER PUBLICATIONS

R.K. Smeltzer "Epitazial Deposition of Silicon in Deep Grooves," *J Electrochem: Solid-State Science and Technology*, vol. 122, No. 12, p. 1666-71, Dec. 1975.

* cited by examiner

*Primary Examiner*—Hsien-Ming Lee
(74) *Attorney, Agent, or Firm*—Venable LLP; Michael A. Sartori; Thomas C. Schoeffler

(57) ABSTRACT

A fabrication method of a semiconductor wafer can fill trenches formed in a semiconductor substrate with an epitaxial film with high crystal quality without leaving cavities in the trenches. The trenches are formed in the first conductivity type semiconductor substrate. Planes exposed inside the trenches are made clean surfaces by placing the substrate in a gas furnace, followed by supplying the furnace with an etching gas and carrier gas, and by performing etching on the exposed planes inside the trenches by a thickness from about a few nanometers to one micrometer. The trenches have a geometry opening upward through the etching. Following the etching, a second conductivity type semiconductor is epitaxially grown in the trenches by supplying the furnace with a growth gas, etching gas, doping gas and carrier gas, thereby filling the trenches. Instead of making the trenches slightly-opened upward, their sidewalls may be made planes enabling facet formation.

4 Claims, 10 Drawing Sheets

FABRICATION METHOD OF SEMICONDUCTOR WAFER

This application claims priority from Japanese Patent Application No. 2003-062103 filed Mar. 7, 2003, which is incorporated hereinto by reference.

BACKGROUND OF THE INVENTION

1. Field of the Invention

The present invention relates to a fabrication method of a semiconductor wafer, and particularly to a fabrication method of a semiconductor wafer that includes trenches formed in a first conductivity type semiconductor substrate, and has a structure in which the trenches are filled with an epitaxial film composed of a second conductivity type semiconductor.

2. Description of the Related Art

Generally, semiconductor devices are divided into a lateral device having electrodes formed on one side, and a vertical device having electrodes formed on both sides. In the vertical semiconductor device, the direction in which the drift current flows in the on state is the same as the direction in which the depletion layer is extended by a reverse bias voltage in the off state. In an ordinary planar n-channel vertical MOSFET, the drift layer with the high resistance operates as a region through which the drift current flows in the vertical direction in the on state. Accordingly, reducing the length of the current path of the drift layer can decrease the drift resistance, thereby offering an advantage of being able to reduce the effective on-resistance of the MOSFET.

On the other hand, since the drift layer becomes a depletion region in the off state to increase the withstand voltage, the thin drift layer reduces the withstand voltage. On the contrary, as for a semiconductor device with a high withstand voltage, since the drift layer is thick, the on-resistance is large, thereby increasing the loss. Thus, there is a tradeoff between the on-resistance and the withstand voltage.

It is known that the tradeoff also applies to semiconductor devices such as MOSFETs (metal oxide semiconductor field effect transistors), IGBTs (insulated gate bipolar transistors), bipolar transistors and diodes. In addition, the tradeoff is also seen in the lateral semiconductor devices in which the direction in which the drift current flows in the on state differs from the direction in which the depletion layer extends in the off state.

As devices to solve the foregoing problem with the tradeoff, super-junction semiconductor devices are known which include a drift layer having a parallel pn structure composed of the alternate junctions of n-type semiconductor regions and p-type semiconductor regions with increased impurity concentrations (refer to European patent application laid-open No. 0053854, U.S. Pat. Nos. 5,216,275 and 5,438,215, Japanese patent application laid-open No. 266311/1997). The semiconductor devices with such a structure can increase the withstand voltage in spite of the high impurity concentration of the parallel pn structure. This is because the depletion layer spreads in the off state in the lateral direction at the individual pn junctions of the parallel pn structure that extends in the vertical direction, and hence the drift layer is depleted in its entirety.

As for fabrication methods of producing the super-junction wafer used for the fabrication of the foregoing super-junction semiconductor devices, those that can lead to low cost and mass-producibility have been studied actively. For example, a method has been developed of forming trenches in the surface layer of a first conductivity type semiconductor substrate, followed by epitaxial growth of a second conductivity type semiconductor in the trenches. Alternatively, a method has been proposed of filling the trenches with an epitaxial film, followed by oxidizing its surface to eliminate the crystal defect in the epitaxial film near the center of upper part of the trenches (refer to Japanese patent application laid-open No. 340578/2000).

In addition, a method is proposed of forming the parallel pn structure at a narrow pitch by wet anisotropic etching (refer to Japanese patent application laid-open No. 168327/2001). To achieve the narrow pitch, it utilizes a (110) plane as its substrate surface, and forms the contact planes of the n-type semiconductor regions and the p-type semiconductor regions of the parallel pn structure such that they become (111) plane or its equivalent plane, that is, {111} plane, and extend in the [110] direction.

Alternatively, a method is proposed of growing a small amount of the epitaxial film in the trenches, followed by increasing the openings of the trenches by etching part of the epitaxial film, and by filling the trenches without leaving a cavity within the trenches by carrying out the epitaxial growth again (refer to Japanese patent application laid-open No. 196573/2001).

As for a method of forming the trenches, a method of carrying out first etching followed by second etching is proposed (refer to Japanese patent application laid-open No. 141407/2002). The first etching is performed on a semiconductor substrate surface using mixed gas plasma of silicon halide gas or boron halide gas with oxygen or nitrogen. The second etching is conducted using mixed gas plasma of halogen-containing gas with oxygen or nitrogen. The first etching forms the trenches such that their openings have gently sloping tapered planes, whereas the second etching forms them as steep trenches.

However, filling the trenches with the epitaxial film presents the following two problems. The first problem is that since the cleaning technique of the inner walls of the trenches is under development and immature at the present, a trace quantity of silicon oxide ($SiO_x$, where X equals 0, 1 or 2) or amorphous silicon is left in the inner walls of the trenches. The immature cleaning technique can also bring about micro-scale or nano-scale surface roughness, which impairs the quality of the epitaxial film. It has been gradually found that the foreign matters or surface roughness can be removed to some extent by hydro-fluoric acid cleaning, plasma etcher or chemical dry etcher (CDE). However, it is difficult to remove them completely at the present. The second problem is that since the epitaxial film grown thickly around the openings of the trenches blocks the openings, a cavity is apt to be left in the trenches.

The foregoing literatures do not refer to the effect on the epitaxial growth brought about by the foreign matters or roughness on the inner walls of the trenches. For example, the method of forming the trenches disclosed in Japanese patent application laid-open No. 141407/2002 relates to a technique of forming device isolation regions by filling the trenches with the oxide film, or forming an oxide film on the inner walls of the trenches as in trench-type MOSFETs or trench-type capacitors, rather than a technique that fills the trenches with the epitaxial film. Thus, it considers nothing about the foreign matters or roughness on the inner walls of the trenches.

SUMMARY OF THE INVENTION

An object of the present invention to provide a fabrication method of a semiconductor wafer capable of filling trenches formed in a semiconductor substrate with an epitaxial film with a high crystal quality without leaving a cavity in the trenches.

According to one aspect of the present invention, there is provided a fabrication method of a semiconductor wafer comprising the steps of: forming trenches with a desired pattern in a surface layer of a first conductivity type semiconductor substrate; performing, in a gas furnace, etching on exposed planes inside the trenches by supplying etching gas into the gas furnace; and filling the trenches by epitaxially growing a second conductivity type semiconductor in the trenches after completing the etching. According to the present invention, the planes exposed inside the trenches are etched in a range from a few nanometers to one micrometer. Consequently, the planes exposed inside the trenches become clean surfaces with little contaminations and disturbances in the crystal structure. Since the epitaxial film is grown on the clean surface, the trenches can be filled with the epitaxial growth film with high crystal quality.

In the present invention, the etching may be performed by setting the pressure of the carrier gas at a value equal to or greater than 100 Torr and equal to or less than 760 Torr. In this case, the diffusing length of the etching gas becomes short so that the amount of the etching gas reaching the bottoms of the trenches is limited. Accordingly, the etching near the openings of the trenches proceeds quickly relatively, thereby making the cross section of the trenches slightly-opened upward. The taper angles of the sidewalls of the trenches after the etching (the angles the sidewalls of the trenches make with the surface of the substrate) become equal to or greater than 87° and less than 90°. Accordingly, even if the epitaxial film is grown rather thickly at the openings of the trenches, the openings of the trenches are not blocked. As a result, the trenches can be filled with the epitaxial film with the high crystal quality without leaving a cavity in the trenches.

In the present invention, the epitaxial growth may be carried out by setting crystal plane orientations of sidewalls of the trenches at orientations that enable facet formation, and by simultaneously supplying or alternately supplying the gas furnace with etching gas and growth gas for accelerating the epitaxial growth of the second conductivity type semiconductor. A dichlorosilane gas is desirable for the growth gas. In this case, because of the facets formed, the sidewalls of the trenches become stable, and the etching gas restrains the epitaxial growth of the sidewalls of the trenches. Accordingly, the epitaxial growth rate is lo faster at the bottoms than on the sidewalls of the trenches. In addition, setting the pressure of the carrier gas at a low pressure during the etching can control the concentrations of the etching gas approximately equal at the bottoms and near the openings of the trenches. Consequently, the etching proceeds at substantially the same rate on the entire surfaces of the trenches so that the inner walls of the trenches are smoothed with forming the facets. Thus, the trenches are filled with the epitaxial film with the high crystal quality without leaving a cavity in the trenches.

In the present invention, the step of etching may perform the etching on the exposed planes inside the trenches such that widths of openings of the trenches become greater than widths of bottoms of the trenches.

According to the present invention, a fabrication method of a semiconductor wafer is provided which is capable of filling the trenches formed in the semiconductor substrate with the epitaxial film with the high crystal quality without leaving a cavity in the trenches.

The above and other objects, effects, features and advantages of the present invention will become more apparent from the following description of embodiments thereof taken in conjunction with the accompanying drawings.

DETAILED DESCRIPTION OF THE PREFERRED EMBODIMENTS

The embodiments in accordance with the present invention will now be described with reference to the accompanying drawings. In the following descriptions, it is assumed that silicon is used as the semiconductor material, and that the first conductivity type is n-type and the second conductivity type is p-type. The assumptions, however, are only examples, but not limitations. Thus, the present invention is also applicable to cases that employ other semiconductor materials or the opposite conductivity types, that is, the p-type as the first conductivity type and the n-type as the second conductivity type. In addition, since the present invention relates to a fabrication method of a semiconductor wafer, the structure of devices formed on the wafer or the fabrication process is not limited, and the description and the drawings thereof are omitted here. For example, the present invention is applicable to the substrate of a MOSFET, IGBT, bipolar transistor, GTO thyristor or diode.

Embodiment 1

Figure 1:
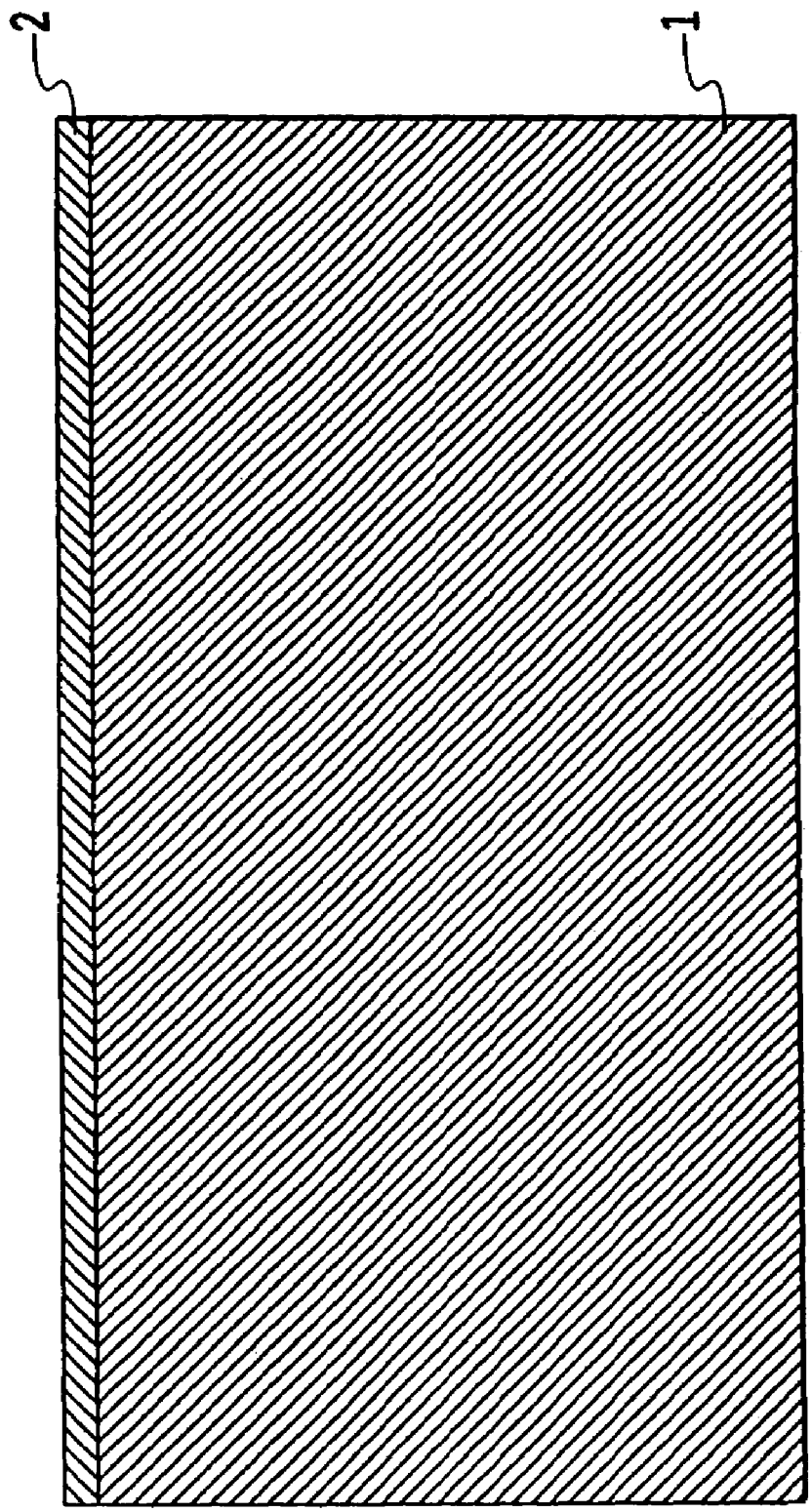
FIG. 1 is a cross-sectional view showing a fabrication process of a semiconductor wafer of an embodiment 1 in accordance with the present invention.

FIGS. 1–5 are cross-sectional views showing a fabrication process of a semiconductor wafer of an embodiment 1 in accordance with the present invention. First, as shown in FIG. 1, a mask oxide film 2 is formed on a surface of an n-type silicon substrate 1 by thermal oxidation or CVD (Chemical Vapor Deposition). It is also possible to use an insulating film such as a nitride film as the mask besides the oxide film.

Figure 2:
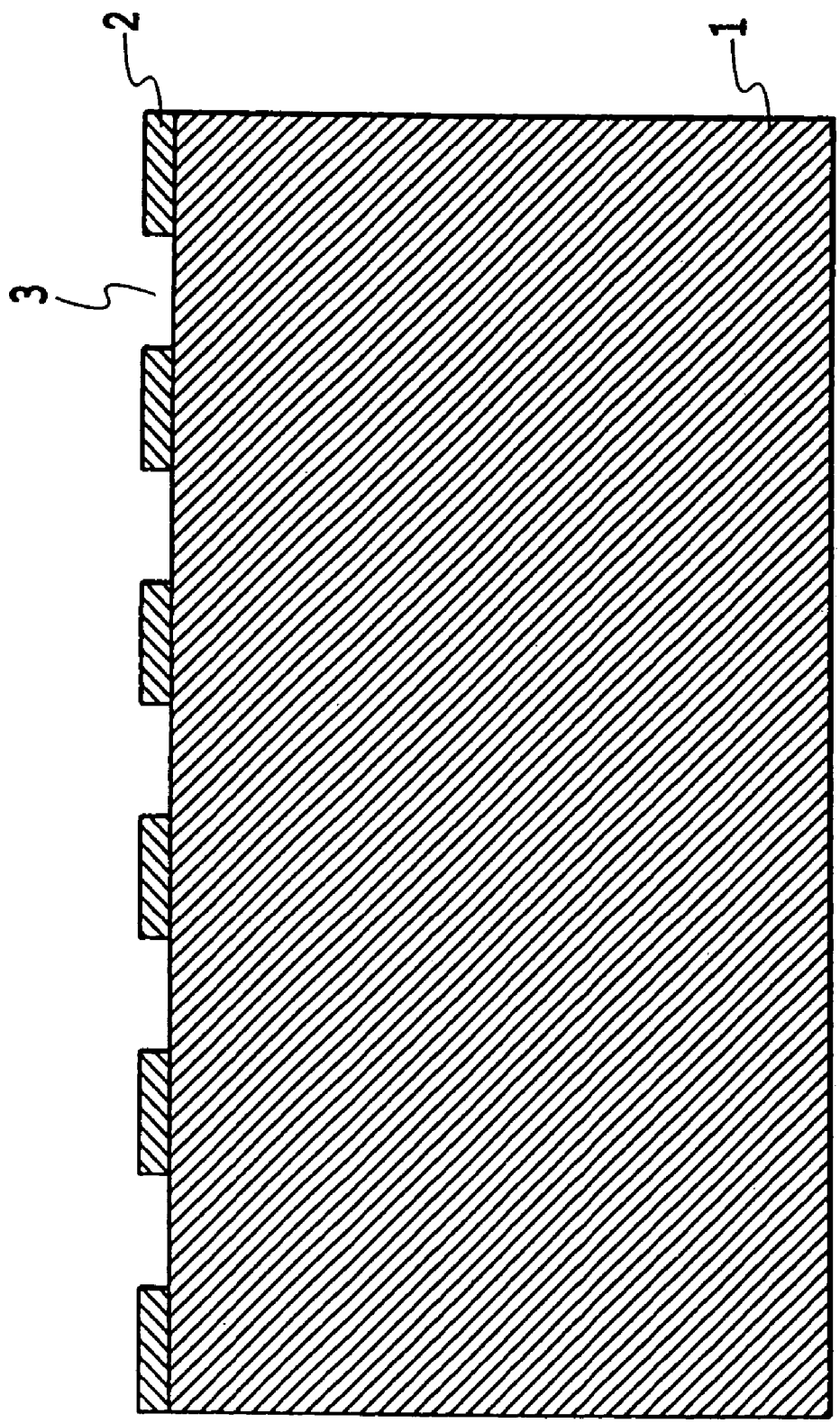
FIG. 2 is a cross-sectional view showing the fabrication process of the semiconductor wafer of the embodiment 1 in accordance with the present invention.

Subsequently, an alignment target is formed for mask alignment. Then as shown in FIG. 2, windows are formed in the mask oxide film 2 by the photolithography using a mask not shown, thereby forming openings 3 in the mask oxide film 2 for forming trenches. The pattern of the openings 3 can be a stripe-like or lattice-like pattern, or other geometry.

Figure 3:
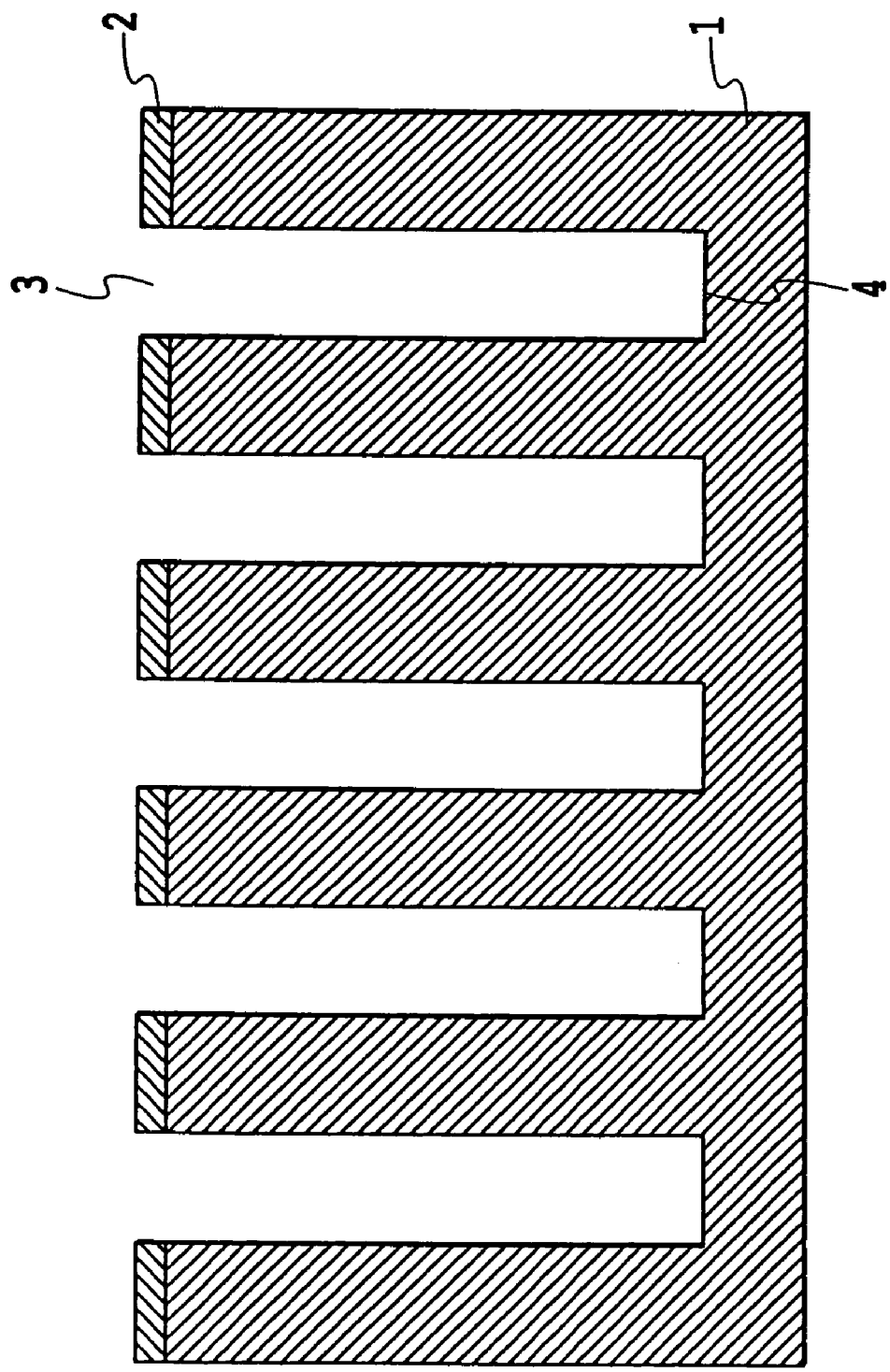
FIG. 3 is a cross-sectional view showing the fabrication process of the semiconductor wafer of the embodiment 1 in accordance with the present invention.

Subsequently, as shown in FIG. 3, trenches 4 with a desired depth are formed by removing the regions corresponding to the openings 3 from the silicon substrate 1. The trenches 4 are formed by anisotropic plasma etching or RIE (reactive ion etching) or by anisotropic wet etching or the like using the oxide film 2 as the mask. The size of the trenches is approximately 5 μm wide by 50 μm deep in the case of a silicon device with a withstand voltage of 600 V, for example. As for the silicon device with the withstand voltage of 600 V, the impurity concentration of the silicon substrate 1 is preferably on the order of $5 \times 10^{15}$ cm$^{-3}$ to $1 \times 10^{16}$ cm$^{-3}$.

Subsequently, the interiors of the trenches 4 are cleaned with dilute hydro-fluoric acid or buffered hydro-fluoric acid. Preferably, damages to the crystals on the inner walls of the trenches are removed using plasma etcher or CDE or the like, or by forming a sacrificial oxide film of a thickness of 50 nm and less, followed by removing it using the hydro-fluoric acid.

The cleaning and damage removing process can remove a trace quantity of oxide or amorphous silicon deposited on the inner walls of the trenches 4, and the crystal damages and contaminations on the inner walls of the trenches 4 nearly completely although not perfectly.

Although the cleaning and damage removing process can erode the inner walls of the trenches 4 by a thickness of about a few nanometers to 0.5 micrometers, that is not shown in FIG. 3.

Subsequently, the silicon substrate 1 is placed in an epitaxial growth furnace to undergo the surface cleaning by high temperature annealing at around 1000° C. Then, the gas containing halogen such as HCl is supplied into the furnace as etching gas. In addition to the etching gas, carrier gas such as hydrogen, which is generally used, but not limited to, is supplied. Thus, the inner walls of the trenches 4 are shaved by etching by a thickness of the order of a few nanometers to one micrometer, thereby producing clean surfaces.

As for the temperature of the etching, it is preferably 1000° C. and over to increase the rate of the etching. However, if the amount of the etching is small, it may be 1000° C. and less.

As for the pressure of the carrier gas, on the other hand, it is preferably higher than 100 Torr and lower than 760 Torr in the present embodiment 1. This is because when the carrier gas pressure is 100 Torr and over, the vapor diffusion length of HCl or the like is shortened so that the concentration of the HCl or the like becomes high at the openings of the trenches 4 and low at the bottoms of the trenches 4, and hence the etching proceeds quickly at the openings than at the bottoms of the trenches 4. Furthermore, it is appropriate that the upper limit of the carrier gas pressure is set at 760 Torr, the atmospheric pressure, for the reason of the mechanical design of the epitaxial growth furnace.

Figure 4:
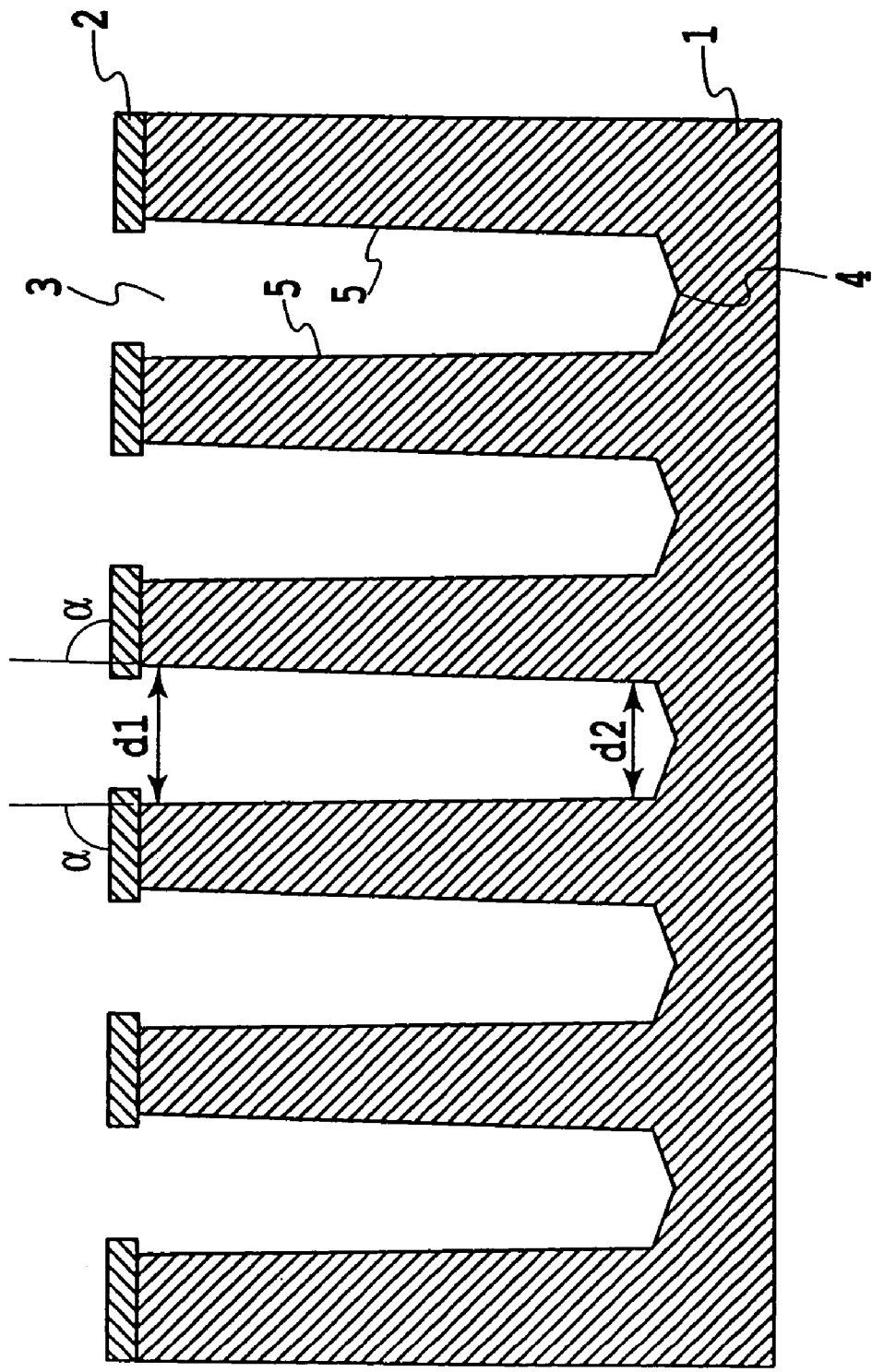
FIG. 4 is a cross-sectional view showing the fabrication process of the semiconductor wafer of the embodiment 1 in accordance with the present invention.

As described above, since the etching rate varies at the tops and bottoms of the trenches 4, the trenches 4 have a cross section slightly-opened upward as shown in FIG. 4. In FIG. 4, d1 is greater than d2 (d1>d2), where d1 and d2 are the widths at the top and bottom of the trenches 4, respectively. In this case, the taper angle a of the sidewalls of the trenches is equal to or greater than 87° and less than 90°.

During the etching, facets with a rather low stability are liable to appear at the bottoms of the trenches 4. In FIG. 4, the recession of the sidewalls 5 of the trenches 4 by the etching is exaggerated. In practice, however, the adjacent p-type semiconductor region (corresponding to the trenches 4) and n-type semiconductor region (corresponding to the portion of the semiconductor substrate between two adjacent trenches 4) have substantially the same width as the components constituting the super-junction structure.

Figure 5:
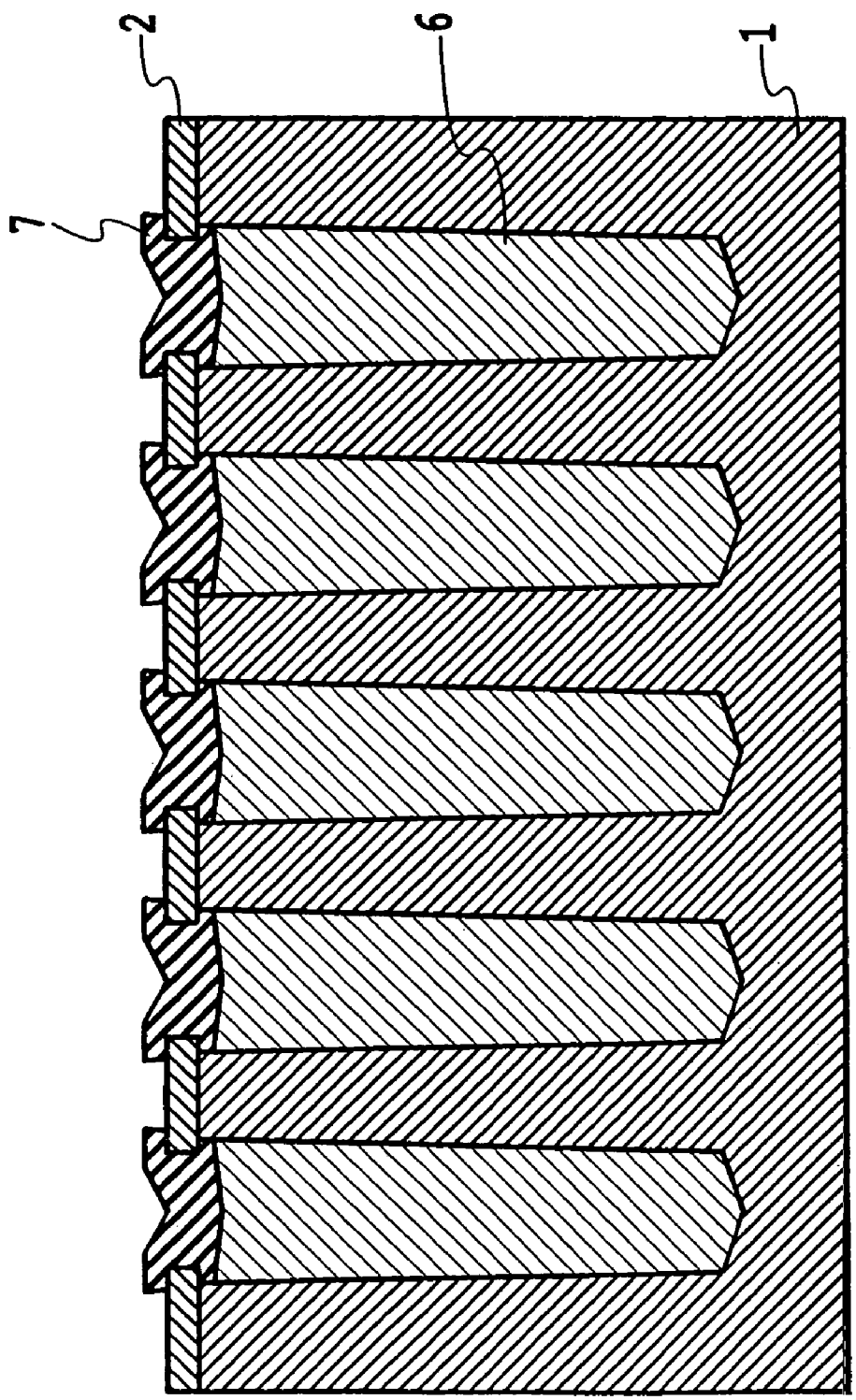
FIG. 5 is a cross-sectional view showing the fabrication process of the semiconductor wafer of the embodiment 1 in accordance with the present invention.

Subsequently, as the continuous processing in the epitaxial growth furnace, the furnace is supplied with silane family gas such as dichlorosilane (SiH$_2$Cl$_2$) and trichlorosilane (SiHCl$_3$) serving as the growth gas, with doping gas such as diborane, with gas containing halogen such as HCl serving as the etching gas, and with hydrogen serving as the carrier gas, for example. Thus, as shown in FIG. 5, a p-type semiconductor 6 is epitaxially grown in the trenches 4 so that the trenches 4 are filled with the p-type semiconductor 6.

The reason for using the foregoing growth gas including chlorine is that to carry out the epitaxial growth with the etching using the growth gas can prevent the openings of the trenches 4 from being blocked first. The adhering probability of the dichlorosilane is equal to or less than 0.01, whereas the adhering probability of the trichlorosilane is equal to or greater than 0.1. Accordingly, although having the growth rate smaller than the trichlorosilane, the dichlorosilane is preferable because it fills the trenches in a more conformal manner. However, since the trenches 4 are slightly-opened upward in the present embodiment 1 and the etching gas is mixed in the trenches 4 slightly, the trichlorosilane is also applicable as the growth gas without any inconvenience.

As described above, in the present embodiment, since the growth gas includes chlorine, and the trenches 4 are slightly-opened upward, it can prevent cavities from being left in the trenches 4. In addition, since the etching effect caused by a slight amount of etching gas can delay the epitaxial growth rate at the openings of the trenches 4, it can relatively increase the epitaxial growth rate at the bottoms of the trenches 4. Accordingly, it can fill the trenches 4 with the p-type semiconductor 6 without leaving the cavities in the trenches 4.

Furthermore, the mixed etching gas can improve the uniformity of the film thickness.

To improve the uniformity of the film thickness, it is preferable that the growth gas has a longer average free path. Accordingly, it is preferable in the epitaxial growth process that the pressure of the carrier gas (hydrogen) be equal to or less than 100 Torr, or more preferably equal to or less than 40 Torr. In addition, the gas supply ratios of the growth gas (dichlorosilane (SiH$_2$Cl$_2$)), the etching gas (HCl) and the doping gas (diborane) are preferably 1:1.5:0.01, for example. These values are only an example, and can vary when the deposition rate is increased, or the size and aspect ratio of the trenches 4 are varied geometrically.

After the trenches 4 have been filled, a trace quantity of polysilicon 7 can adhere to the edges of the mask oxide film 2 as shown in FIG. 5. Thus, the polysilicon 7 and mask oxide film 2 are removed in the subsequent surface polishing process. In this way, the super-junction wafer is completed.

According to the present embodiment 1, since the inner walls of the trenches 4 are etched by a thickness from a few nanometers to one micrometer in the etching process after forming the trenches, the inner walls of the trenches 4 become clean surfaces, and the trenches 4 are slightly-opened upward. Accordingly, the present embodiment 1 can fill with the high crystal quality epitaxial film in the trenches 4 without leaving the cavity in the trenches 4.

Embodiment 2

Figure 6:
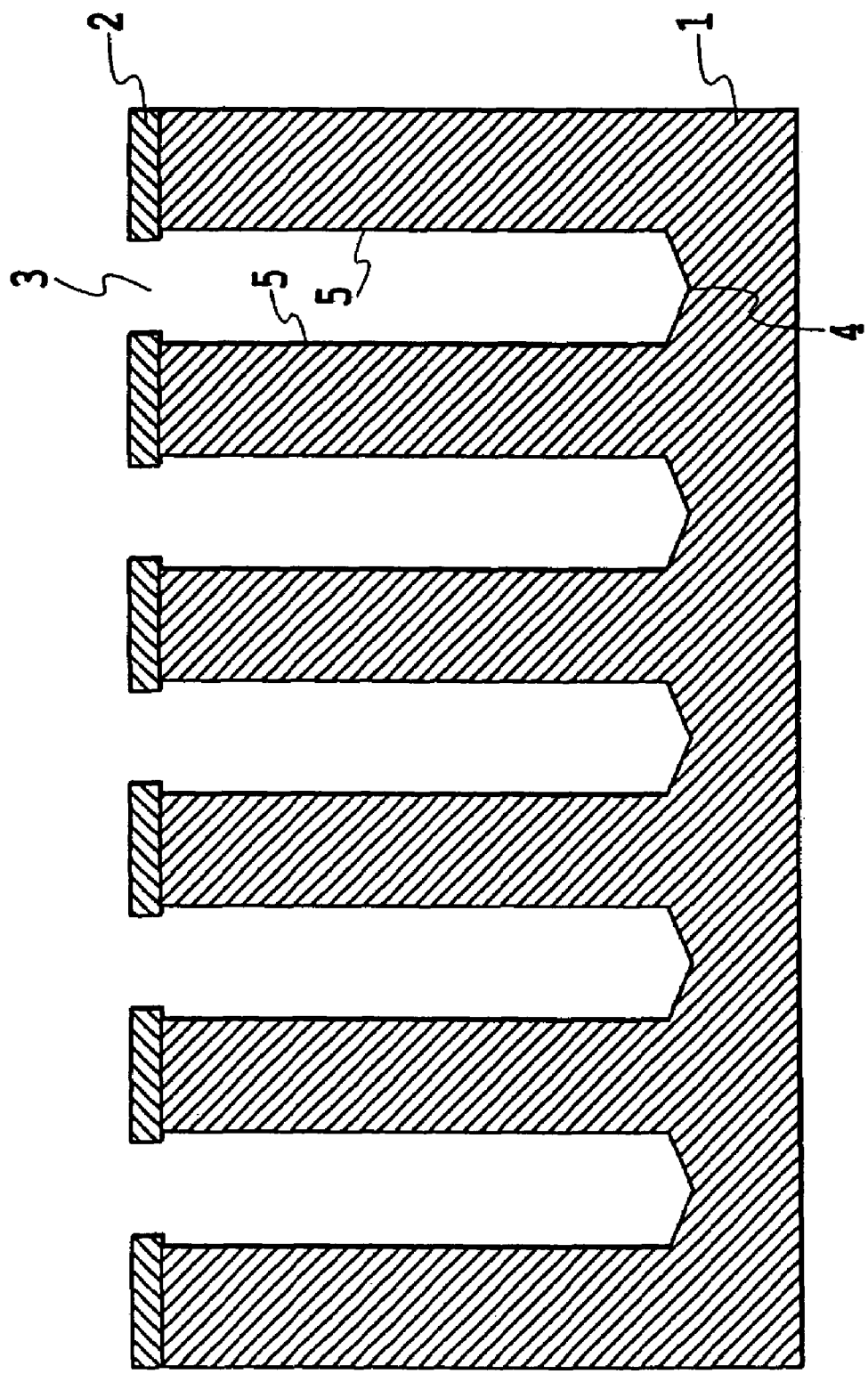
FIG. 6 is a cross-sectional view showing a fabrication process of a semiconductor wafer of an embodiment 2 in accordance with the present invention.
Figure 7:
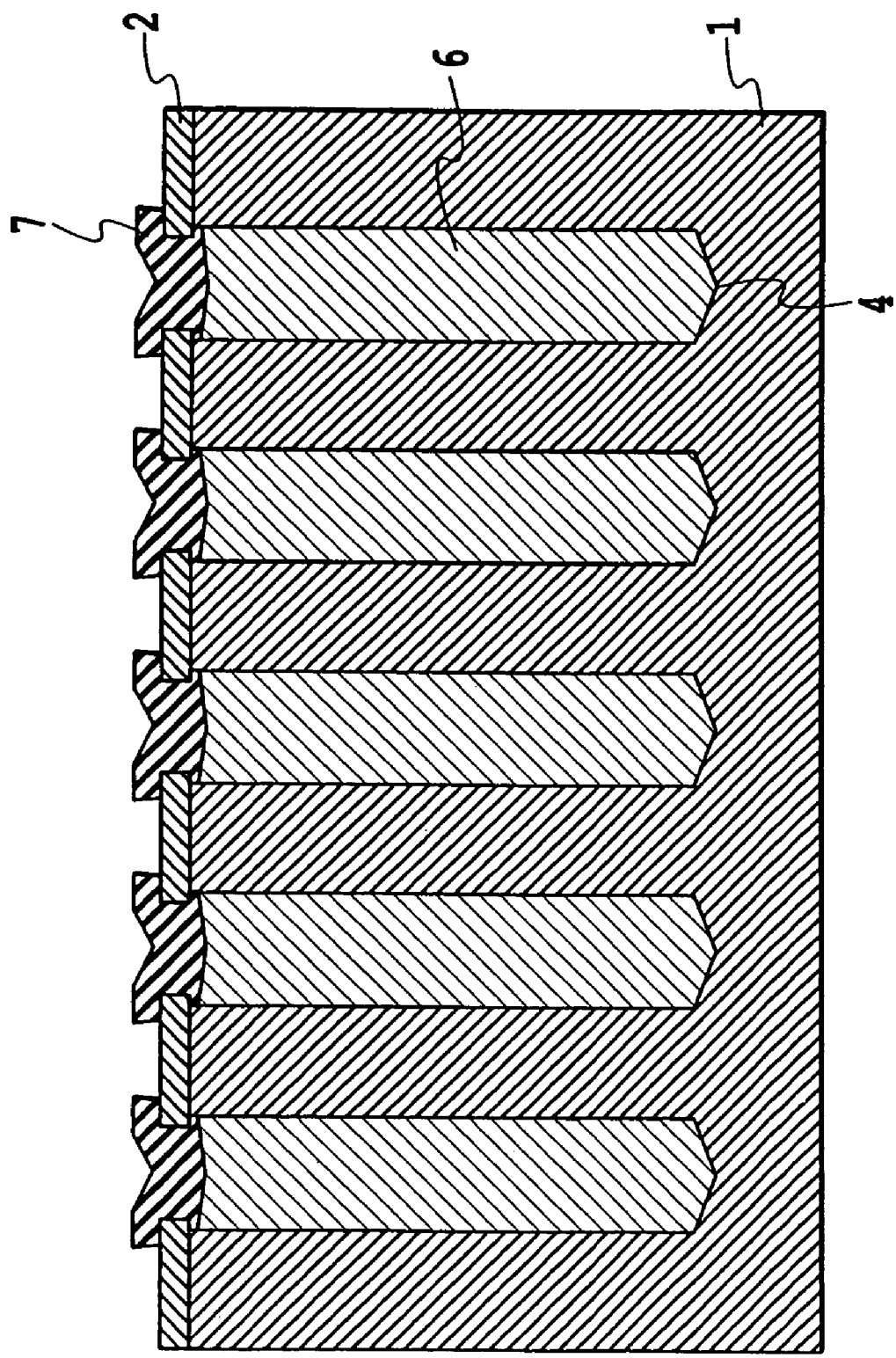
FIG. 7 is a cross-sectional view showing the fabrication process of the semiconductor wafer of the embodiment 2 in accordance with the present invention.

FIGS. 6 and 7 are cross-sectional views showing a fabrication process of a semiconductor wafer of an embodiment 2 in accordance with the present invention. The embodiment 2 differs from the foregoing embodiment 1 in that when the sidewalls 5 of the trenches 4 consist of the planes, on which facets are formed in the etching process after forming the trenches, the planes are exposed to the sidewalls of the trenches 4 rather than slightly-opening upward the sidewalls of the trenches. As the planes that form facets in the silicon crystal, the (111) plane, (311) plane, (411) plane, (100) plane and the planes equivalent to these planes are known. Thus, the sidewalls 5 of the trenches 4 are made (111) plane, (311) plane, (411) plane, (100) plane and the planes equivalent to these planes. As long as they are planes that enable the facet formation, other plane orientations are possible.

It is preferable in the embodiment 2 that the etching using the etching gas like HCl proceeds uniformly on all the regions of the trenches 4 so that the surface roughness is smoothed to form flat facets. To achieve this, the pressure of the carrier gas is set at a value equal to or less than 100 Torr, and preferably at a value equal to or less than 40 Torr.

Reasons for this are as follows. First, the pressure, which allows the vapor diffusion length of HCl or the like to extend to the bottoms of the trenches 4, enables the uniform etching to all the regions including the bottoms of the trenches 4. Second, as for the facets formed by the crystal, their planes have strong stability and the inclination to become even, and hence have characteristics to dislike local etching or being adhered by an epitaxial film.

The etching under such conditions can make clean surfaces as shown in FIG. 6 by eroding the inner walls of the trenches 4 by a thickness of about a few nanometers to one micrometer with the sidewalls of the trenches 4 kept perpendicular to the substrate surface. Although the recession of the sidewalls 5 of the trenches 4 by the etching is exaggerated in FIG. 6, the width of the trenches 4 is nearly equal to the width of the semiconductor substrate portion between two adjacent trenches 4 as in the embodiment 1.

After the etching process, the epitaxial growth is carried out successively. As a result, as shown in FIG. 7, the p-type semiconductor 6 grows epitaxially in the trenches 4 until it fills the trenches 4. The mask oxide film 2 and the polysilicon 7 deposited on its edges are removed by the subsequent surface polishing process.

In this way, the super-junction wafer is completed. In the present embodiment 2, since the process other than the foregoing etching process is the same as that of the embodiment 1, the description thereof is omitted here to avoid duplication.

According to the foregoing present embodiment 2, the inner walls of the trenches 4 are etched in a range equal to or less than a few nanometers to one micrometer in the etching process after forming the trenches. Thus the inner walls of the trenches 4 are made clean surfaces, and the planes that enable the facet formation on the sidewalls of the trenches 4 are exposed. Accordingly, it can fill the trenches 4 with the epitaxial film of the high crystal quality without leaving the cavities in the trenches 4.

Embodiment 3

FIGS. 8–13 are cross-sectional views showing a fabrication method of a semiconductor wafer of an embodiment 3 in accordance with the present invention.

The embodiment 3 differs from the foregoing embodiments 1 and 2 in the following point. The embodiments 1 and 2 supply the furnace with the growth gas and etching gas at the same time in the epitaxial growth process.

In contrast with this, the embodiment 3 carries out the epitaxial growth with alternately supplying the growth gas and etching gas to the furnace little by little.

Figure 8:
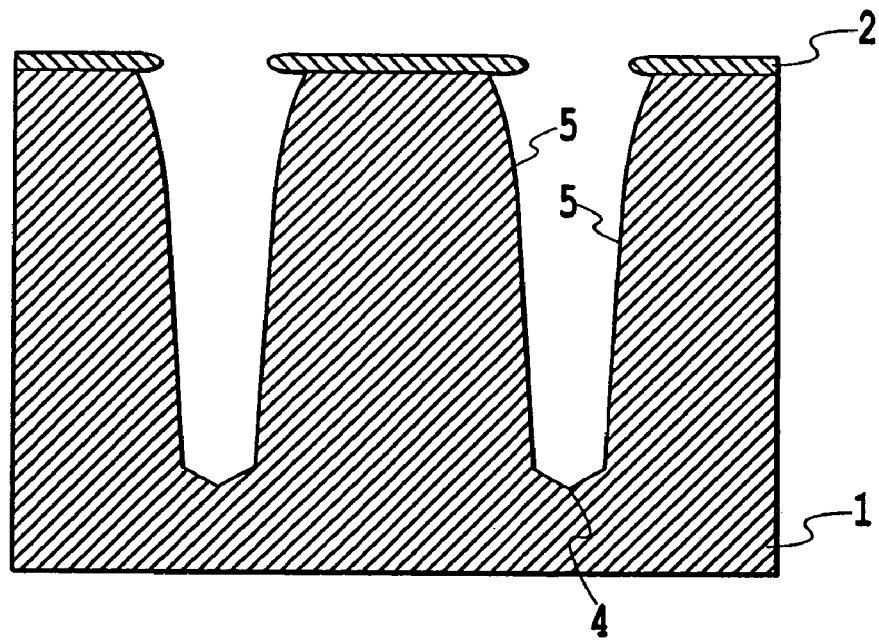
FIG. 8 is a cross-sectional view illustrating a fabrication process of a semiconductor wafer of an embodiment 3 in accordance with the present invention.
Figure 9:
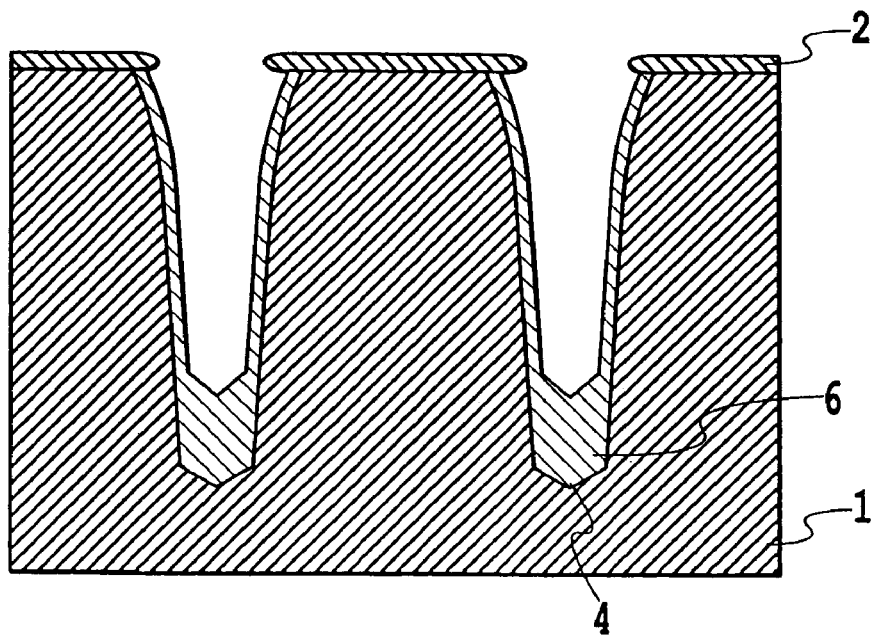
FIG. 9 is a cross-sectional view illustrating the fabrication process of the semiconductor wafer of the embodiment 3 in accordance with the present invention.
Figure 10:
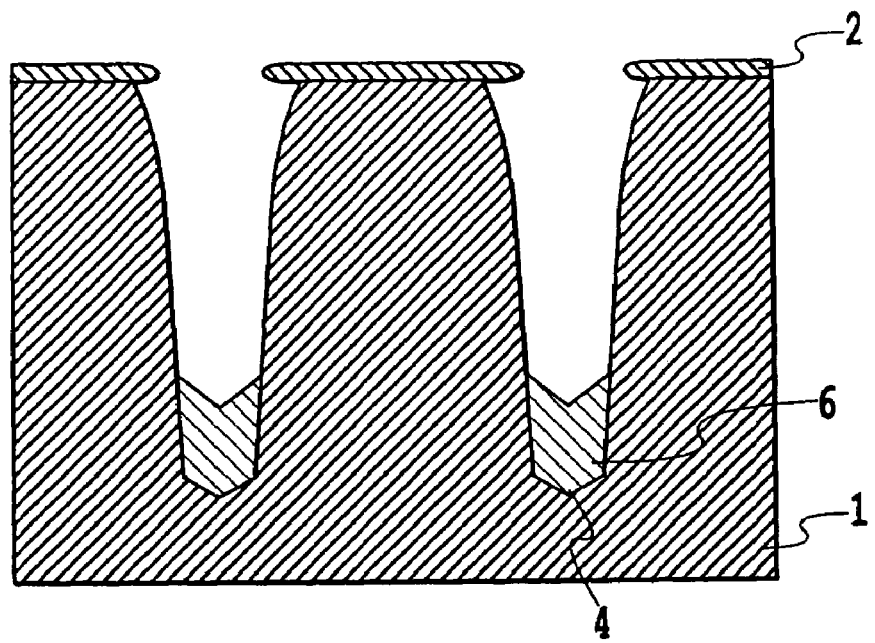
FIG. 10 is a cross-sectional view illustrating the fabrication process of the semiconductor wafer of the embodiment 3 in accordance with the present invention.

In the trenches 4 as shown in FIG. 8, facets are formed on its sidewalls 5. Then, the p-type semiconductor 6 is epitaxially grown by supplying the growth gas in the epitaxial growth process without supplying the etching gas. The grown epitaxial film is thick at the bottoms of the trenches 4 and thin on the sidewalls of the trenches 4 as shown in FIG. 9. Subsequently, the etching gas is supplied instead of the growth gas so that the epitaxial film deposited on the sidewalls of the trenches 4 is removed by the etching as shown in FIG. 10. Since the epitaxial film deposited at the bottoms of the trenches 4 is thick, the greater parts of them remain.

The growth gas is supplied again instead of the etching gas so that the epitaxial film at the bottoms of the trenches 4 become thicker, and a thin epitaxial film is deposited on the sidewalls 5 of the trenches 4. The supply gas is switched to the etching gas again so that the epitaxial film deposited on the sidewalls of the trenches 4 is removed, leaving only thick epitaxial film at the bottoms of the trenches 4. Repeating such steps, the trenches 4 is filled with the p-type semiconductor 6. FIGS. 9 and 10 show the intermediate states of filling the trenches 4.

Figure 11:
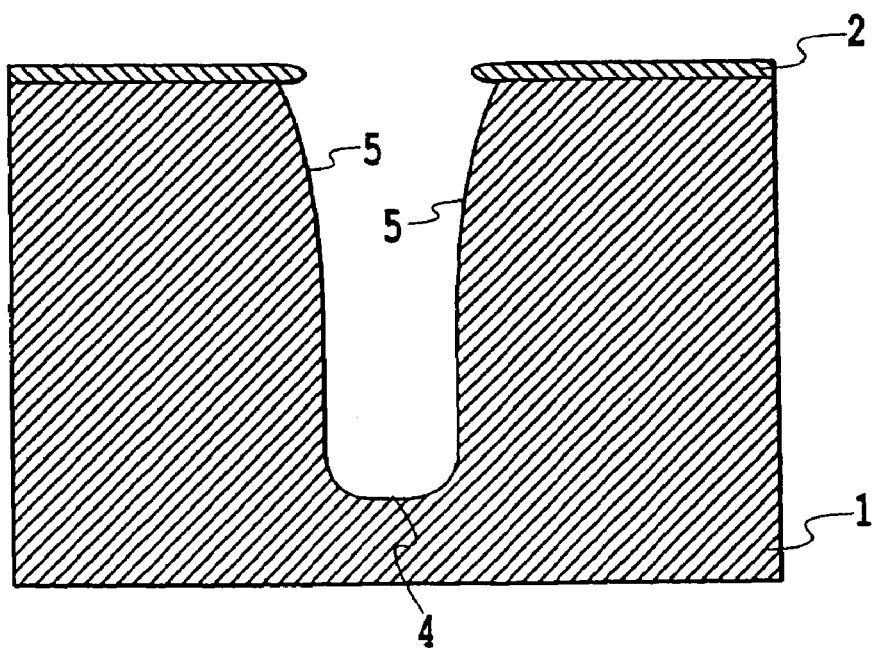
FIG. 11 is a cross-sectional view illustrating the fabrication process of the semiconductor wafer of the embodiment 3 in accordance with the present invention.
Figure 12:
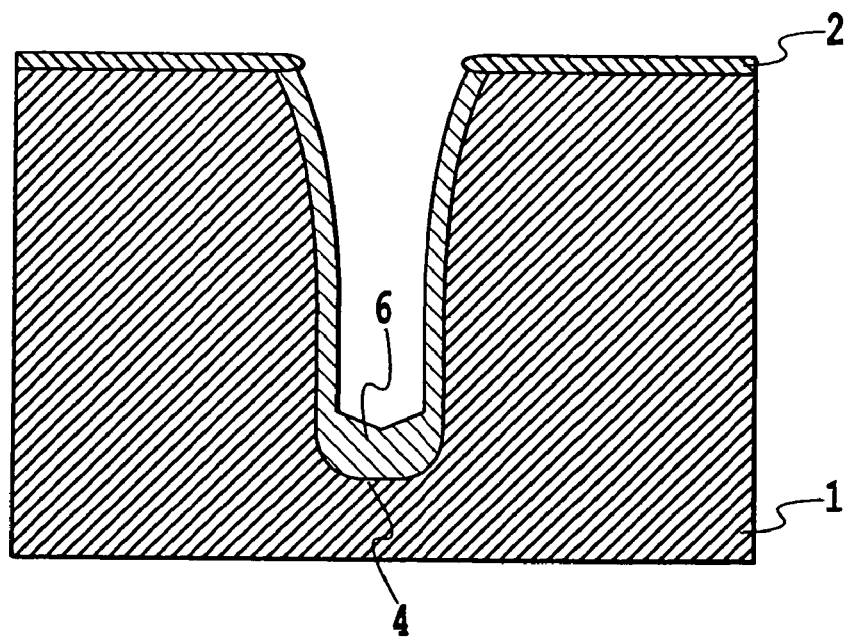
FIG. 12 is a cross-sectional view illustrating the fabrication process of the semiconductor wafer of the embodiment 3 in accordance with the present invention.
Figure 13:
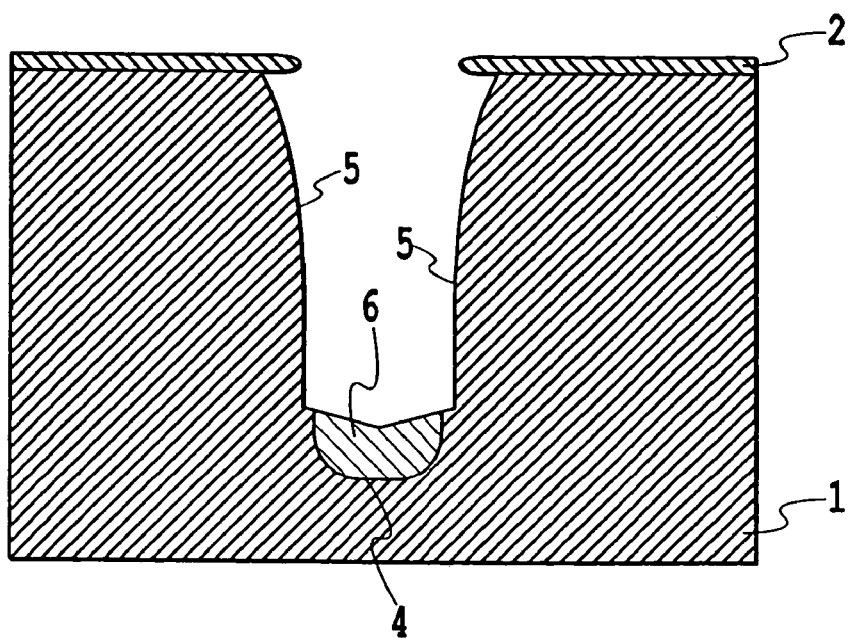
FIG. 13 is a cross-sectional view illustrating the fabrication process of the semiconductor wafer of the embodiment 3 in accordance with the present invention.

However, even when alternating the epitaxial growth and the etching under the same conditions, the sidewalls 5 of the trenches 4 may move back as shown in FIGS. 11–13 when the widths of the trenches 4 differ. FIG. 11 shows the state of the trenches, and FIG. 12 shows the state in which the epitaxial growth is carried out by stopping the etching gas and by supplying the growth gas. When the supply of the growth gas is stopped and the etching gas is supplies in this state, the state as shown in FIG. 13 appears: not only the epitaxial film deposited on the sidewalls of the trenches 4 is removed by the etching, but also the sidewalls of the trenches 4 is eroded. This results from the fact that the amount of the etching is greater than the amount of the epitaxial growth on the sidewalls of the trenches.

Thus, the duty ratio between the epitaxial growth time and the etching time varies depending on the width, aspect ratio and the geometry of the trenches 4. Accordingly, matching of the conditions must be made.

The present invention is not limited to the foregoing embodiments, but various modifications are possible. For example, the width and depth of the trenches 4, and the impurity concentrations of the semiconductors are not limited to the foregoing values.

The present invention has been described in detail with respect to preferred embodiments, and it will now be apparent from the foregoing to those skilled in the art that changes and modifications may be made without departing from the invention in its broader aspect, and it is the intention, therefore, in the apparent claims to cover all such changes and modifications as fall within the true spirit of the invention.

What is claimed is:

1. A fabrication method of a semiconductor wafer comprising the steps of:
    forming trenches with a pattern in a surface layer of a first conductivity type semiconductor substrate;
    performing, in a gas furnace, etching on exposed planes inside the trenches by supplying etching gas into the gas furnace; and
    filling the trenches by epitaxially growing a second conductivity type semiconductor in the trenches after completing the etching,
    wherein the step of filling carries out the epitaxial growth by setting crystal plane orientations of sidewalls of the trenches at orientations that enable facet formation, and by simultaneously or alternately supplying the gas furnace with etching gas and growth gas for accelerating the epitaxial growth of the second conductivity type semiconductor.

2. The fabrication method of a semiconductor wafer as claimed in claim 1, wherein the step of etching performs the etching by setting the pressure of a carrier gas at a value equal to or greater than 100 Torr and equal to or less than 760 Torr.

3. The fabrication method of a semiconductor wafer as claimed in claim 1, wherein the growth gas is a dichlorosilane gas.

4. The fabrication method of a semiconductor wafer as claimed in claim 1, wherein the step of etching performs the etching on the exposed planes inside the trenches such that widths of openings of the trenches become greater than widths of bottoms of the trenches.

* * * * *

UNITED STATES PATENT AND TRADEMARK OFFICE
CERTIFICATE OF CORRECTION

| | | |
|---|---|---|
| PATENT NO. | : 7,029,977 B2 | Page 1 of 1 |
| APPLICATION NO. | : 10/792884 | |
| DATED | : April 18, 2006 | |
| INVENTOR(S) | : Daisuke KISHIMOTO et al. | |

It is certified that error appears in the above-identified patent and that said Letters Patent is hereby corrected as shown below:

Title page, item
(75) <u>Fourth Inventor</u>:

Replace RYOHSUKE SHIMIZU with <u>RYOSUKE SHIMIZU</u>.

Signed and Sealed this

Fifteenth Day of August, 2006

JON W. DUDAS
*Director of the United States Patent and Trademark Office*